hwang et al.

United States Patent [19]

Patent Number: 5,912,510
Date of Patent: *Jun. 15, 1999

[54] BONDING STRUCTURE FOR AN ELECTRONIC DEVICE

[75] Inventors: Lih-Tyng Hwang, Phoenix; William H. Lytle, Chandler, both of Ariz.

[73] Assignee: Motorola, Inc., Schaumburg, Ill.

[*] Notice: This patent issued on a continued prosecution application filed under 37 CFR 1.53(d), and is subject to the twenty year patent term provisions of 35 U.S.C. 154(a)(2).

[21] Appl. No.: 08/672,389

[22] Filed: May 29, 1996

[51] Int. Cl.⁶ .......................... H01L 23/48; H01L 23/52; H01L 29/40
[52] U.S. Cl. .......................... 257/778; 257/777; 257/780; 257/783
[58] Field of Search ..................... 257/778, 779, 257/777, 780, 783

[56] References Cited

U.S. PATENT DOCUMENTS

| | | | |
|---|---|---|---|
| 3,480,412 | 11/1969 | Duffek, Jr. et al. | 257/778 |
| 4,369,458 | 1/1983 | Thomas et al. | 257/778 |
| 4,931,149 | 6/1990 | Stierman et al. | 257/778 |
| 5,046,161 | 9/1991 | Takada | 257/778 |
| 5,059,553 | 10/1991 | Berndlmaier et al. | 257/778 |
| 5,268,072 | 12/1993 | Agarwala et al. | 257/778 |
| 5,422,516 | 6/1995 | Hosokawa et al. | 257/778 |
| 5,461,261 | 10/1995 | Nishiguchi | 257/778 |
| 5,554,887 | 9/1996 | Sawai et al. | 257/778 |
| 5,600,180 | 2/1997 | Kusaka et al. | 257/778 |
| 5,619,071 | 4/1997 | Myers et al. | 257/753 |

FOREIGN PATENT DOCUMENTS

| | | | |
|---|---|---|---|
| 4024102 | 8/1979 | Japan | 257/778 |
| WO9315521 | 8/1993 | Japan | 257/778 |

*Primary Examiner*—Teresa M. Arroyo
*Attorney, Agent, or Firm*—Kenneth M. Seddon

[57] ABSTRACT

A bonding structure (10) is formed between a first component (12) and a second component (11) to form a semiconductor device. The bonding structure (10) comprises a bump (24) that has a pedestal region (22) and a crown region (23). The crown region (23) is anchored into a well region (13) of a conductive material (16) that is formed on the second component (11).

16 Claims, 1 Drawing Sheet

BONDING STRUCTURE FOR AN ELECTRONIC DEVICE

BACKGROUND OF THE INVENTION

This invention relates, in general, to electronic devices, and more particularly to bonding a first electronic component to a second electronic component.

Some electronic devices require a physical and electrical bond between two components as is commonly done using flip-chip techniques. For example, it may be necessary to bond a glass substrate to a semiconductor device to form an optical device. One method to do this is to first form a bond bump on one component using a wire bonder. Traditionally, a wire bonder is used to form a ball with a spike structure that protrudes from one end of the ball. A conductive material, such as a conductive epoxy, is formed on the second component and then impaled by the spike to provide the physical and electrical bond between the two components.

One problem with such bonding structures is that they are not very tolerant of physical stress even if they are used in conjunction with an adhesive underfill material. Stress, either mechanical or thermal, between the two components can cause the spike to become loose from the conductive epoxy. Once the physical bond is broken, the electrical contact between the two components is lost.

By now it should be appreciated that it would be advantageous to provide a bonding structure between electronic components that has improved resistance to mechanical stress.

DETAILED DESCRIPTION OF THE DRAWINGS

In general, the present invention relates to a bonding structure between the two components of an electronic device. A portion of the bonding structure is formed on each of the two components and then the components are joined together and held by the bonding structure. The bonding structure comprises a bump formed on one component and a well of conductive material on the other component. When placed in contact with each other, the bump becomes affixed in the well of conductive material to hold the components together and provide the necessary electrical connections for the electronic device.

The bump on the first component comprises a crown region that is formed on a pedestal region. The crown region is then immersed into the well of conductive material so that the conductive material surrounds the crown region. As a result, the bonding structure is more resistant to mechanical stress since the crown region is anchored in the well of conductive material. This provides not only a resilient physical bond between the two components, but a reliable electrical bond as well.

The bonding structure of the present invention has many applications in the electronics industry. The bonding structure can be used to provide just a physical bond between two components or can be used to provide both a physical and electrical bond as well. As is described below in the manufacturing process of the preferred embodiment, the pedestal region and the crown region may be formed from the same material using a single deposition process. Therefore, their composition is homogeneous and does not require multiple deposition steps of different materials as is done in the art.

Figure 1:
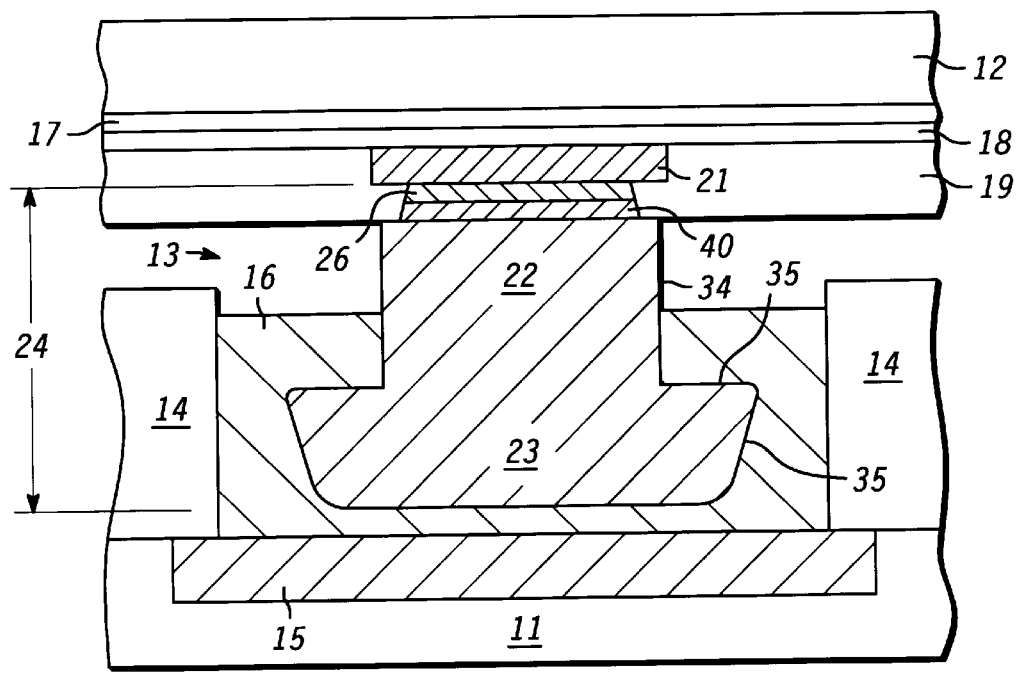
FIG. 1 is an enlarged cross-sectional view of a bonding structure in accordance with the present invention.

Turning now to FIG. 1, a more detailed description of the present invention is provided. FIG. 1 is an enlarged cross-sectional view of a portion of a semiconductor device showing a bonding structure 10 between a first component 12 and a second component 11. In the preferred embodiment, as shown in FIG. 1, first component 12 is a semiconductor substrate and second component 11 is a plastic package. However, the present invention can be used to form a bond between a variety of materials for a variety of applications. For example, either first component 12 or second component 11 can be a silicon substrate, a gallium arsenide substrate, a glass substrate, a magnetic material, a ceramic package, a pin grid array package, a semiconductor die, or other material used in the electronics industry.

Bonding structure 10 comprises a bump 24 that is formed on a bonding pad 21 on first component 12. Bump 24 has a crown region 23 that is formed on a pedestal region 22. Bonding structure 10 further comprises a well region 13 of a conductive material 16 formed on second component 11. Well region 13 is defined as the portion of conductive material 16 between isolation regions 14 and is connected to an electrically active structure 15. As shown in FIG. 1, crown region 23 and a portion of pedestal region 22 are immersed in the conductive material 16 of well region 13. A surface 35 of crown region 23 and a portion of a sidewall or sidewalls 34 of pedestal region 22 are in contact with conductive material 16. As a result, bump 24 is anchored or held in place in well region 13 so that first component 12 and second component 11 are held together.

Because conductive material 16 completely envelops crown region 23, bonding structure 10 has improved tolerance to mechanical stress than a structure that simply pierces a conductive material. Crown region 23 is actually held by conductive material 16 so that if bump 24 should undergo force relative to well region 13, bump 24 might still be held in place by conductive material 16. It should also be understood that conductive material 16 need not reside in a well region, and could simply be a film of material spread across the surface of second component 11.

Also shown in FIG. 1 is a first insulating layer 17, a second insulating layer 18, and a third insulating layer 19. These layers along with bonding pad 21 should be considered optional. Their use depends on the electrical properties of first component 12, the manufacturing process used to make bonding structure 10, and the electrical application that uses bonding structure 10. First insulating layer 17 and second insulating layer 18 could be made from the same material or different materials and comprise insulating materials such as silicon dioxide, silicon nitride, or the like. Their primary function is to electrically isolate portions of first component 12 from bonding structure 10. Third insulating layer 19 can be made from similar insulating materials and can be used to passivate the surface of first device 12.

Figure 2:
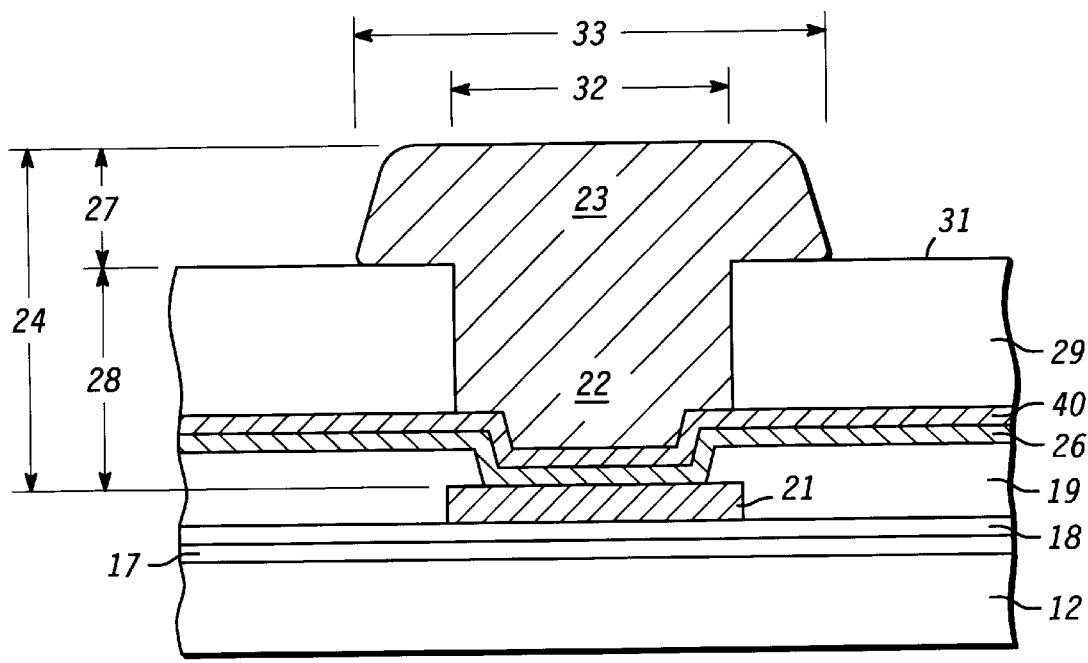
FIG. 2 is an enlarged cross-sectional view of the bonding structure at an intermediate point in its fabrication process.

Turning now to FIG. 2, a detailed description pertaining to the manufacture of bump 24 is provided. Bump 24 can be formed using either an electroplating or an electroless plating process. In the following narration, an electroplating process is described and one skilled in the art will understand the changes necessary to form bump 24 using an electroless process.

To begin, first component 12 is provided, which can be a variety of materials such as a semiconductor substrate. If necessary, first insulating layer 17 and second insulating layer 18 are formed using a conventional chemical vapor deposition (CVD) or a plasma enhanced chemical vapor deposition (PECVD) process. If desired, bonding pad 21 can be formed by depositing and patterning a conductive material such as aluminum, aluminum alloy, copper, nickel, or the like. It should also be understood that it is possible to form bump 24 directly on first insulating layer 17, second insulating layer 18, or directly on first component 12.

Third insulating layer 19 is then formed preferably by CVD deposition of a silicon oxide layer. Third insulating layer 19 is then patterned such that portions of bonding pad 21 are exposed as shown in FIG. 2. In an electroplating process, an electroplating layer 26 and an adhesion layer 40 are formed on third insulating layer 19 and the exposed portions of bonding pad 21. It will be understood by one skilled in the art that the use and composition of electroplating layer 26 and adhesion layer 40 will vary depending on the composition of bonding pad 21. A sputtering or CVD process can be used to deposit a conductive layer of material such as tungsten, titanium, titanium-nitride, titanium-tungsten, nickel or the like. Electroplating layer 26 performs many functions such as retarding the diffusion of material between bond pad 21 and bump 24, and providing a voltage potential during the electroplating process to follow. Adhesion layer 40 is used to provide a seed layer or adhesion layer for bump 24.

A masking layer 29, comprising such materials as photoresist, silicon dioxide, silicon nitride, or the like, is deposited and patterned to define the region where pedestal region 22 will be formed. The thickness of masking layer 29 is adjusted to determine the height of pedestal region 22, and the width of the openings in masking layer 29 will determine the width of pedestal region 22. First component 12 is then placed into an electroplating solution such as a solution of copper sulfate to form bump 24. A voltage potential, relative to the solution, is placed on first component 12 using electroplating layer 26 to attract the metal ions and from bump 24. As the electroplating process proceeds, the opening in masking layer 29 will fill with conductive material to form pedestal region 22. Like conventional plating processes, conductive material is only formed on the conductive portions of first component 12 that are exposed to the plating solution.

As shown in FIG. 2, pedestal region 22 has a height 28 that is the distance from bonding pad 21 to the top surface 31 of masking layer 29. Preferably, height 28 is about 5 microns to 1,000 microns. Pedestal region 22 also has a width 32 that is defined by masking layer 29 and is about 20 microns to 10,000 microns. The plating process is allowed to continue to form crown region 23 on pedestal region 22. As metal ions are attracted to pedestal region 22, bump 24 grows along the surface 31 of masking layer 29 to form crown region 23. As a result, bump 24 has a "mushroom-like" appearance. As shown in FIG. 2, crown region 23 has a height 27 that is preferable less than height 28 of pedestal region 22 and is about 2 microns to 1,000 microns. Preferably the height of pedestal region 22 is greater than the height of crown region 23 by a ratio of 2 to 1 or greater, or even more preferably, a ratio of 4 to 1 or greater. Crown region 23 also has a width 33 that is about 30 microns to 10,000 microns and is greater than the width 32 of pedestal region 22.

It should be understood that it is possible to form bump 24 such that pedestal region 22 and crown region 23 are made from different materials. To do this, the electroplating process would be stopped after forming pedestal region 22 and then immersing first component 12 into a different electroplating solution to form crown region 23.

Referring back now to FIG. 1, the remaining process steps to form bonding structure 10 are provided. Once the plating process is complete, masking layer 29 is removed to expose the underlying portions of adhesive layer 40. A wet etch or and reactive ion etch (RIE) is then used to remove the exposed portions of electroplating layer 26 and adhesion layer 40. If an electroless plating process is used to form bump 24, then pedestal region 22 can be formed directly on bonding pad 21 without the use of electroplating layer 26 and adhesive layer 40.

Well region 13 is formed on second component 11 using isolation regions 14. In the preferred embodiment, isolation regions 14 are made from a non-conductive material so that bonding structure 10 is electrically isolated from any neighboring structures (not shown). Well region 13 is then filled with conductive material 16 which can comprise a conductive polymer, a silver-filled epoxy, silver-filled cyano-urate, solder ball, solder paste, or the like. Again, the use of well region 13 is optional as conductive material 16 could be formed as a film of material across the surface of second component 11. Conductive material 13 could also be just a material or adhesive material and need not be conductive.

First component 12 and second component 11 are then aligned to each other and a tacking pressure is applied so that crown region 23 of bump 24 is inserted into well region 13. Bump 24 is pressed into conductive material 16 so that the entire surface 35 of crown region 23 is in contact with conductive material 16. If necessary, a heating step may be performed to cure conductive material 16 so that bump 24 is firmly anchored in place.

Once formed, bonding structure 10 has improved resistance to stress than some previously known bonding structures. Instead of simply piercing a conductive material, the present invention is formed such that a crown portion of the bonding structure is completely encased and anchored in the conductive material. In addition, the surface area of bump 24 offers improved electrical performance to previously known spike structures and can be formed in a batch process as opposed to forming spike structures one at a time.

By now it should be appreciated that the present invention provides a bonding structure and a method of making the same that has improved resistance to stress. By anchoring a portion of the bonding structure in conductive material, the present invention provides a reliable electrical contact between two components of a semiconductor device. The present invention also provides a method of forming the bonding structure using fewer processing steps, and thus at a reduced manufacturing cost, than some previously known bonding structures.

We claim:

1. An electronic device having a bonding structure, the bonding structure comprising:

a substrate having a surface;

a bonding pad overlying the surface of the substrate;

a pedestal region overlying the bonding pad, wherein the pedestal region has a height, a width, and sidewalls;

a crown region overlying the pedestal region, wherein the crown region has a height, a width, and an outer surface along an entire perimeter of the crown region, and wherein the crown region and the pedestal region provide a bump;

a well of conductive polymer, such that the conductive polymer is in contact with at least a portion of the sidewalls of the pedestal region and the outer surface of the crown region, wherein a layer of the conductive polymer is over the entire outer surface of the crown region; and wherein the height of the crown region is less than the height of the pedestal region and the width of the crown region is greater than the width of the pedestal region.

2. The electronic device of claim 1 wherein the height of the pedestal region is about 5 microns to 1,000 microns.

3. The electronic device of claim 2 wherein the height of the crown region is about 2 microns to 1,000 microns.

4. The electronic device of claim 3 wherein the width of the pedestal region is about 20 microns to 10,000 microns.

5. The electronic device of claim 3 wherein the width of the crown region is about 30 microns to 10,000 microns.

6. The electronic device of claim 1 wherein the crown region and the pedestal region are homogeneous and are formed from a same material.

7. A bonding structure between a first component and a second component, the bonding structure comprising:
  a pedestal region having a height, a width, and a sidewall with the pedestal region overlying a portion of the first component;
  a crown region having a height, a width, and a surface with the crown region overlying the pedestal region, wherein the height of the pedestal region is greater than the height of the crown region by a ratio of 2 to 1 or greater, and wherein the crown region and the pedestal region provide a bump; and
  a material overlying a surface of the second component, wherein the material is in contact with a portion of the sidewall of the pedestal region and the entire surface of the crown region, and a portion of the material physically separates the crown region from the second component so that no portion of the crown region is in contact with the second component.

8. The bonding structure of claim 7 wherein the material is contained in a well on the surface of the second component.

9. The bonding structure of claim 8 wherein the crown region is anchored in the well by the material.

10. The bonding structure of claim 7 further comprising a bonding pad formed on the first component and the bonding pad is formed from a different material than the pedestal region.

11. The bonding structure of claim 7 wherein the height of the pedestal region is about 4 microns to 1,000 microns and the height of the crown region is about 2 microns to 1,000 microns.

12. The bonding structure of claim 11 wherein the width of the pedestal region is about 20 microns to 10,000 microns and the width of the crown region is about 30 microns to 10,000 microns.

13. The bonding structure of claim 7 wherein the material overlying the surface of the second component is conductive.

14. An electronic component comprising:
  a pedestal region having a height and a sidewall;
  a crown region overlying the pedestal region and having a height and a surface, wherein the height of the pedestal region is greater than the height of the crown region, and wherein the crown region and the pedestal region provide a bump; and
  a material in contact with a portion of the sidewall of the pedestal region and the surface of the crown region, wherein an entire surface of the crown region is in contact with the material.

15. The electronic component of claim 14 wherein the height of the pedestal region is greater than the height of the crown region by a ratio of about 2 to 1 or greater.

16. An electronic device comprising:
  a first component;
  a pedestal region having a sidewall and a height, wherein the pedestal region is coupled to the first component;
  a crown region coupled to the pedestal region, wherein the crown region is defined by an outer surface and has a height that is at least twice has high as the height of the pedestal region, and wherein the crown region and the pedestal region provide a bump;
  a second component providing a bonding surface; and
  a material overlying the bonding surface of the second component, wherein the material is in contact with at least a portion of the sidewall of the pedestal region and the entire outer surface of the crown region, and a portion of the material physically separates the outer surface of the crown region from the second component so that no portion of the crown region is in contact with the second component.

* * * * *